United States Patent
Letocart et al.

(10) Patent No.: US 9,099,588 B2
(45) Date of Patent: Aug. 4, 2015

(54) THIN-FILM COMPONENT ON GLASS, A METHOD FOR THE PRODUCTION THEREOF AND THE USE THEREOF

(75) Inventors: Philippe Letocart, Raeren (BE); Dang Cuong Phan, Aachen (DE); Dana Pakosch, München (DE); Jean-Christophe Giron, Edina, MN (US); Pascal Remy, Uebach-Palenberg (DE)

(73) Assignee: SAINT-GOBAIN GLASS FRANCE (FR)

( * ) Notice: Subject to any disclaimer, the term of this patent is extended or adjusted under 35 U.S.C. 154(b) by 428 days.

(21) Appl. No.: 13/395,883

(22) PCT Filed: Aug. 24, 2010

(86) PCT No.: PCT/EP2010/062295
§ 371 (c)(1),
(2), (4) Date: Jul. 3, 2012

(87) PCT Pub. No.: WO2011/039000
PCT Pub. Date: Apr. 7, 2011

(65) Prior Publication Data
US 2012/0266945 A1 Oct. 25, 2012

(30) Foreign Application Priority Data
Sep. 30, 2009 (DE) .......... 10 2009 044 142

(51) Int. Cl.
*H01L 31/00* (2006.01)
*H01L 31/048* (2014.01)
*H01L 31/02* (2006.01)
*H01L 31/046* (2014.01)

(52) U.S. Cl.
CPC ........ *H01L 31/048* (2013.01); *H01L 31/02021* (2013.01); *H01L 31/046* (2014.12); *H01L 2924/0002* (2013.01); *Y02E 10/50* (2013.01)

(58) Field of Classification Search
CPC ............ H01L 31/02021; H01L 31/046; H01L 31/0463; H01L 31/0465
See application file for complete search history.

(56) References Cited

U.S. PATENT DOCUMENTS

| | | | |
|---|---|---|---|
| 5,542,988 A | 8/1996 | Bogus | |
| 5,593,901 A * | 1/1997 | Oswald et al. .................. | 438/80 |
| 6,225,552 B1 * | 5/2001 | Nishi et al. ..................... | 136/256 |
| 8,647,995 B2 * | 2/2014 | Aitken et al. ................... | 501/69 |
| 2002/0195136 A1 * | 12/2002 | Takabayashi et al. ........ | 136/244 |
| 2004/0053125 A1 | 3/2004 | Giron et al. | |

(Continued)

FOREIGN PATENT DOCUMENTS

| CN | 1975978 A | 6/2007 |
|---|---|---|
| CN | 101517473 A | 8/2009 |

(Continued)

OTHER PUBLICATIONS

English translation and original Written Opinion for PCT Application No. PCT/EP2010/062295 filed on Aug. 24, 2010 in the name of Saint-Gobain Glass France; mail date: Apr. 4, 2011.

(Continued)

*Primary Examiner* — Eli Mekhlin
(74) *Attorney, Agent, or Firm* — Steinfl & Bruno LLP

(57) ABSTRACT

A thin-film component comprising a film structure and an electrically conductive protection device is disclosed, together with a method for the production and use thereof.

21 Claims, 6 Drawing Sheets

(56) References Cited

U.S. PATENT DOCUMENTS

| | | |
|---|---|---|
| 2006/0196535 A1 | 9/2006 | Swanson et al. |
| 2008/0283115 A1* | 11/2008 | Fukawa et al. ............... 136/246 |
| 2009/0078304 A1 | 3/2009 | Gilmore et al. |
| 2009/0101191 A1 | 4/2009 | Beck et al. |
| 2009/0268450 A1 | 10/2009 | Kojoh et al. |
| 2010/0096012 A1* | 4/2010 | Straub ............................ 136/259 |

FOREIGN PATENT DOCUMENTS

| | | |
|---|---|---|
| DE | 36 17 675 | 12/1986 |
| DE | 39 35 826 | 6/1990 |
| DE | 198 02 325 | 8/1999 |
| DE | 199 54 259 A1 | 5/2001 |
| DE | 19954259 B4 | 5/2001 |
| DE | 100 54 776 | 2/2002 |
| DE | 10 2007 050554 A1 | 4/2009 |
| EP | 2068370 A1 * | 6/2009 |
| JP | 60-189 272 | 9/1985 |
| JP | 10-335686 A | 12/1998 |
| JP | 2009188357 A | 8/2009 |
| WO | 2007/002 955 | 3/2007 |
| WO | 2007/061033 A1 | 5/2007 |
| WO | 2008/012461 A2 | 1/2008 |
| WO | WO 2009020349 A2 * | 2/2009 |

OTHER PUBLICATIONS

English translation and original International Preliminary Report for Patentability for PCT Application No. PCT/EP2010/062295 filed on Aug. 24, 2010 in the name of Saint-Gobain Glass France; mail date: Apr. 4, 2011.

PCT Search Report of International Application PCT/EP2010/062295 filed on Aug. 24, 2010 in the name of Saint-Gobain Glass France.

1$^{st}$ Office Action issued on Apr. 9, 2014 for Chinese Patent Application No. 201080044001.6, which was filed on Aug. 24, 2010 in the name of Saint-Gobain Glass France. Includes English translation.

2$^{nd}$ Office Action issued on Dec. 9, 2014 for Chinese Patent Application No. 201080044001.6, which was filed on Aug. 24, 2010 in the name of Saint-Gobain Glass France. Includes English translation.

Office Action mailed on Nov. 26, 2013 for Japanese Patent Application No. 2012-531303.

* cited by examiner

THIN-FILM COMPONENT ON GLASS, A METHOD FOR THE PRODUCTION THEREOF AND THE USE THEREOF

CROSS REFERENCE TO RELATED APPLICATIONS

This application is the U.S. national stage of International Application PCT/EP2010/062295 filed on Aug. 24, 2010, which in turn claims priority to German Application No. DE 10 2009 044 142.5 filed Sep. 30, 2009, hereby incorporated by reference in its entirety.

The present invention relates to a thin-film component on glass permanently protected against moisture and high electric field strengths, a method for the production thereof, and the use thereof.

Thin-film components are exposed to intense weather conditions, for example, as photovoltaic modules on open field or roof systems with high electrical voltages of up to 1000 V. Thin-film photovoltaic modules customarily include monolithically integrated thin-film photovoltaic cells, which corrode in the presence of moisture in the photovoltaic module. It is also known that, due to the high electric system voltages, electrical transients can occur between the photovoltaic cells and the ground potential and the resultant high electric field strengths, or ions can drift out of the glass into the thin films of the photovoltaic cells. Corrosion or delamination of the photovoltaic cells leads to permanent degradation of performance or to complete failure of the photovoltaic modules.

Photovoltaic systems for feeding electrical energy into the public power grid include a circuit of photovoltaic modules and inverters for the conversion of DC voltage into AC voltage.

To reduce degradation of performance in long-term use, photovoltaic systems in which the potential is raised are known from DE 10 2007 050 554 A1. The potential of the positive pole of the circuit of photovoltaic modules is shifted in the inverter relative to the ground potential such that no uncontrolled electrical discharges from the photovoltaic module to ground occur.

Also known are inverters for photovoltaic systems that galvanically separate the photovoltaic modules from the potential to the ground via an isolating transformer to prevent uncontrolled discharges from the photovoltaic system to ground.

However, for this, inverters that are expensively adapted to the photovoltaic modules and have low electrical efficiency must be used.

The object of the present invention is to provide an improved thin-film component on glass that has, independent of the inverter, high long-term stability against weather conditions along with high electric field strengths.

The object is accomplished through the characteristics set forth in claims 1, 13, and 17.

In the thin-film component according to the invention, a film structure and an electrically conductive protection device are applied to a glass pane, at least one dielectric protection film is applied to the film structure and the electrically conductive protection device, and the distance between the electrically conductive protection device and the outside edge of the glass pane is smaller than the distance between the film structure and the outside edge of the glass pane.

The thin-film components according to the invention can have external forms as are customary in accordance with their functionality. Film structures can, in particular, have a photovoltaic, electrochromic, light-emitting, or a heating function. Preferably, the thin-film components have the form of sheets. The sheet area can be 100 $cm^2$ up to 18 $m^2$, but preferably 0.5 $m^2$ to 3 $m^2$. The thin-film components can be implemented planar or curved.

The film structure customarily includes front electrode and rear electrode layers. A film system having a photovoltaic, electrochromic, light-emitting, or heating function is applied between the electrode layers. The electrode layers contain preferably silver, gold, copper, nickel, chromium, tungsten, molybdenum, tin oxide, zinc oxide, aluminum, indium tin oxide, silicon dioxide, silicon nitride, and/or combinations as well as mixtures. The film structure is, particularly preferably, a monolithically integrated electrical serial circuit.

The film structure is preferably circumferentially decoated on the edge of the glass pane with a width of preferably 5 mm to 20 mm in order to be protected on the edge against moisture penetration or shading from attachment elements.

An electrical field is established because of different electric potentials between the ground potential of the immediate surroundings of the thin-film component and the film structure. The surroundings at ground potential can, for example, be represented by grounded attachment means of the thin-film component or a conductive film of water with short-circuit to ground on the thin-film component.

Preferably, DC voltages appear between the electrodes. However, electrical AC voltages or even electrical transients may appear.

The electrically conductive protection device is, according to the invention, preferably arranged between the film structure and the outside edge of the glass edge such that the maximum electric field strength appears in the region of the electrically conductive protection device and not in the region of the functional film structure. Drift of ions of the glass pane caused by the electric field or electric discharges are shifted from film structure to the electrically conductive protection device.

A conventional photovoltaic, electrochromic, light-emitting, and/or heatable film structure has at least two electrical poles. One pole is preferably at ground potential. The second pole can be positive as an anode or negative as a cathode relative to the first pole.

In another advantageous embodiment, the electrically conductive protection device is galvanically connected to one pole of the film structure via at least one contact area. Via the galvanic connection, the electrically conductive protection device is at the electric potential of one pole of the film structure. The electrically conductive protection device is preferably connected to a pole that has, relative to the photovoltaic module, the highest negative electric potential difference to the surrounding ground potential.

The electrically conductive protection device can, however, also be connected with an additional external voltage source that supplies an electric potential that is greater than or equal to the maximum negative electric potential of the film structure.

Particularly preferably, the electrically conductive protection device is galvanically connected on the pole to the front electrode layer of the film structure.

Alternatively, the electrically conductive protection device is galvanically connected on the pole to the rear electrode layer of the film structure.

In another advantageous embodiment of the invention, the film structure is completely surrounded by the electrically conductive protection device and thus shields the film structure circumferentially. The electrically conductive protection device can be completely or partially covered by the attachment means and/or by an opaque screen print.

The line widths of the electrically conductive protection device have, preferably, a width of 0.5 mm to 5 mm.

The electrically conductive protection device can have all shapes that provides a higher electric field strength on the electrically conductive protection device compared to the film structure. The electrically conductive protection device is preferably formed line-shaped, meander-shaped, comb-like, or in the form of connected rectangles and, preferably constitutes, in the overall unit, a frame shape. Preferably, the electrically conductive protection device is configured as a circumferential frame around the film structure.

In an advantageous embodiment of the invention, electrically conductive attachment means are applied on the thin-film component, preferably on the outside edge of the glass pane.

In another advantageous embodiment of the invention, electric conductive attachment means on the outside edge of the glass pane at least partially surround the thin-film component. Preferably, electric conductive attachment means are configured as a circumferential frame along the outside edge of the thin-film component.

The electrically conductive attachment means can, however, also preferably be implemented as interrupted frames, circumferential frames, or as fittings. The attachment of the component, for example, on racks is accomplished by screwing, clamping, and/or adhesive bonding of the attachment elements. The electric potential of the attachment means customarily corresponds to the ground potential of a reference system, preferably the earth potential or the ground potential of a motor vehicle body.

The electrically conductive protection device can have a plurality of nested frames that are galvanically connected to each other via a plurality of contact areas.

In another advantageous embodiment of the invention, the electrically conductive protection device contains silver, gold, copper, nickel, chromium, tungsten, molybdenum, tin oxide, zinc oxide, aluminum, indium tin oxide, silicon dioxide, silicon nitride, and/or combinations as well as mixtures thereof.

The electrically conductive protection device can be applied as a coating or also as wires or networks of wires.

It is particularly advantageous if the electrically conductive protection device and the attachment means has the same material as the front electrode layer or rear electrode layer of the film structure.

The electric conductive protection device can, however, also contain a different material than the film structure to achieve higher long-term stability against moisture, high field strengths, impurities from the glass, and delamination.

The electrically conductive protection device can also be designed as a sacrificial layer that changes chemically or delaminates over the service life of the thin-film component. The function of the film structure is not affected by this.

The invention is particularly advantageous if the glass pane contains 0.1 wt.-% to 20 wt.-% and preferably 10 wt.-% to 16 wt.-% alkali elements, preferably $Na_2O$.

In another advantageous embodiment of the invention, the dielectric protection film contains silicate glass, polyvinyl butyral (PVB), polyurethane (PU), polypropylene (PP), polyacrylate, polyethylene (PE), polycarbonate (PC), polymethylmethacrylate, polyvinyl chloride, polyacetate resin, casting resins, acrylates, ethylene vinyl acetate (EVA), fluorinated ethylene propylenes, polyvinyl fluoride, ethylene-tetrafluoroethylene, copolymers, and/or mixtures thereof.

Preferably, the dielectric protection film contains a composite of adhesion-enhancing ethylene vinyl acetate and polyvinyl fluoride or adhesion-enhancing polyvinyl buytral in conjunction with an additional silicate glass pane.

In a particularly advantageous embodiment, the film structure contains thin-film photovoltaic cells with silicon, chalcopyrite, and/or cadmium-telluride.

The glass pane with the film structure and electrically conductive protection device can form the glass pane of the thin-film photovoltaic module facing the light incidence, but also the glass pane turned away from the light incidence.

The object of the invention is further accomplished through a method for the production of a thin-film component, wherein a film structure is applied to a glass pane, an electrically conductive protection device is applied to the glass pane, at least one dielectric protection film is applied to the film structure and the electrically conductive protection device, and the glass pane, film structure, electrically conductive protection device, and dielectric protection film are connected to form a thin-film component.

In an advantageous embodiment of the method according to the invention, the electrically conductive protection device is formed by laser cutting-ablation or mechanical abrasion from subareas of the film structure with insulating lines.

In another embodiment, the electrically conductive protection device is applied by a printing method such as screen printing, engraving cylinder printing, ink jet printing, aerosol jet printing, flexography, pulse jet printing, and/or combinations thereof.

The electrically conductive protection device can also be produced by the combination of laser cutting-ablation, mechanical abrasion, or the printing method.

In an advantageous embodiment of the method according to the invention, attachment parts are screwed on, clamped on, bonded on with adhesive in at least subareas of the outside edge of the glass pane.

The invention relates further relates to the use of the thin-film components as photovoltaic modules and a serial circuit of photovoltaic modules with a negative electric potential to ground of at least −100 V and preferably at least −600 V.

Exemplary embodiments of the invention are depicted schematically in FIG. 1 through 6.

They depict

FIG. 1 a cross-section through an exemplary embodiment of a thin-film component (I) according to the invention along the cut A-A' of FIG. 2, FIG. 2 a plan view of an exemplary embodiment of the thin-film component (I) according to the invention, FIG. 3 a plan view of an alternative exemplary embodiment of the thin-film component (I) according to the invention, FIG. 4 a plan view of another alternative exemplary embodiment of the thin-film component (I) according to the invention, FIG. 5 an exemplary embodiment of the method according to the invention in the flow diagram for production of the thin-film component (I), and FIG. 6 an alternative exemplary embodiment of the method according to the invention in the flow diagram for production of the thin-film component (I).

The explanation of the invention with reference to the figures based on the structure and, as applicable, also based on the mode of operation of the invention depicted follows.

FIG. 1 and FIG. 2 depict a thin-film photovoltaic module (I) according to the invention. On a glass pane (1) with a sodium oxide content of 12 wt.-%, there was the film structure (2) with a number of amorphous silicon thin-film photovoltaic cells. The individual strip-shaped photovoltaic cells of the film structure (2) were monolithically integrated and connected in series. The film structure (2) included two amorphous silicon semiconductor transitions in a stack configuration as functional layers. Between the functional layers and the glass pane (1), there was a front electrode layer with fluoride-doped tin oxide. The rear electrode layer of the film structure (2) facing away from the glass pane (1) contained silver.

The film structure (2) was abrasively decoated mechanically in the edge region on one edge (5) of the glass pane (1) with a width of 15 mm. Inside the edge decoating, a 4 mm wide electrically conductive protection device (3) was printed with silver-containing screen printing paste on the glass pane (1). The electrically conductive protection device (3) completely framed the film structure (2) with a distance of 5 mm between them. The electric conductive protection device (3) and the front electrode of the thin-film photovoltaic cell were galvanically connected on the pole (2a) to the highest electric potential of the thin-film photovoltaic module via a contact area (7) with silver screen printing.

Through the contact area (7), the electrically conductive protection device (3) had the same electric potential as the region (2a) of the film structure (2). The film structure (2) and the electrically conductive protection device (3) were protected in a composite with two dielectric protection devices (4) with polyvinyl buytral and and a back glass pane from environmental effects, in particular, moisture. The outside edge (5) of the thin-film photovoltaic module (I) was framed by an aluminum frame as an electric conductive attachment (8). The clamping of the attachment frame (8) was implemented with a depth of 5 mm on the surfaces of the glass panes (1,4).

The open circuit voltage of the thin-film photovoltaic module (I) was −600 V relative to the ground potential. The positive pole was galvanically connected via an inverter (not shown) without an isolating transformer to the ground potential. The attachment frame (8) was likewise on the ground potential. The region (2a) was the negative pole of the thin-film photovoltaic module (I). The region (2a) and the electric conductive protection device (3) had the maximum negative potential difference relative to the ground potential. The distance between the attachment frame (8) and the electrically conductive protection device (3) was smaller than the distance between the attachment frame (8) and the film structure (2). Because of the greater field strengths in the region of the electrically conductive protection device (3), the drift of ions, in particular of positively charged sodium ions, was increasingly directed to the electrically conductive protection device (3). Accumulation of impurities in the region of the film structure (2) was not observed. Even with the entry of moisture via the edge (8) into the edge region of the thin-film photovoltaic module (I) and the high electric field strengths, no corrosion or delamination of the film structure (2) was observed. After long-term weathering, incipient delamination and corrosion of the electrically conductive protection device (3) were observed. The functionality of the film structure (2) was not impaired. It was surprising and unambiguous that the drift of impurities into the film structure (2) and the permanent degradation of performance of the thin-film photovoltaic module (I) associated therewith under weathering with simultaneously high electric field strengths could be prevented by the electric conductive protection device (3) according to the invention.

FIG. 2 illustrates in a plan view the exemplary embodiment according to the invention of FIG. 1. The thin-film photovoltaic module (I) had an area of 1.2 m×0.6 m and was completely framed by a frame with aluminum as an electrically conductive attachment (8). The attachment frame (8) had the potential of the ground. Through the transparent glass pane (1) (not shown), the likewise frame-shaped electrically conductive protection device (3) that was galvanically contacted via the contact area (7) on the pole (2a) is depicted. The electrically conductive protection device (3) framed the film structure (2) completely. It is clearly discernible in the plan view that the distance between the attachment frame (8) and the electrically conductive protection device (3) was smaller than the distance between the attachment frame (8) and the film structure (2).

FIG. 3 depicts a plan view of an alternative embodiment of the thin-film photovoltaic module (1) according to the invention. The electrically conductive protection device (3) included a transparently conductive oxide and was formed from the further development of the front electrode layer of the film structure (2). Through edge decoating of 7 mm and circumferential insulating lines (9) with a width of 100 μm and interruptions in the contact area (7), a frame-shaped region was formed as a transparent electrically conductive protection device (3) gebildet. In the contact areas (7), the frame-shaped electrically conductive protection device (3) were galvanically connected on the pole (2a). In the embodiment of the invention, an electric conductive protection device (3) was provided in a simple manner from the continuation of the electrode layer of the film structure (2). It was surprising and unambiguous that the drift of impurities into the film structure (2) and the permanent degradation of performance of the thin-film photovoltaic module (I) associated therewith could be prevented by the electrically conductive and transparent protection device (3) according to the invention.

FIG. 4 depicts a plan view of another alternative embodiment of the thin-film photovoltaic module (1) according to the invention. The electrically conductive protection device (3) included a transparently conductive oxide and was formed from the continuation of an electrode layer of the film structure (2). Through edge decoating of 7 mm and two circumferential 100 μm wide insulating lines (9) with interruptions in the contact area (7), two frame-shaped regions were formed as a transparent electrically conductive protection device (3). In the contact areas (7), the frame-shaped transparent electrically conductive film device (3) was galvanically connected on the pole (2a) via a plurality of contact areas (7). In the embodiment of the invention, electrically conductive protection devices (3) were obtained in a simple manner from the further development of the electrode layer of the film structure (2). Through the implementation of the electrically conductive protection devices (3) as a double frame, the protection function for the film structure (2) was further increased. With degradation of the outer frame of the electrically conductive protection device (3) by delamination after a long-term test, the inner frame of the electrically conductive protection device (3) and the film structure (2) remained functional. It was surprising and unambiguous that the drift of impurities into the film structure (2) and the permanent degradation of performance of the thin-film photovoltaic module (I) associated therewith could be prevented by the embodiment of the electrically conductive and transparent protection device (3) according to the invention.

Figure 1:
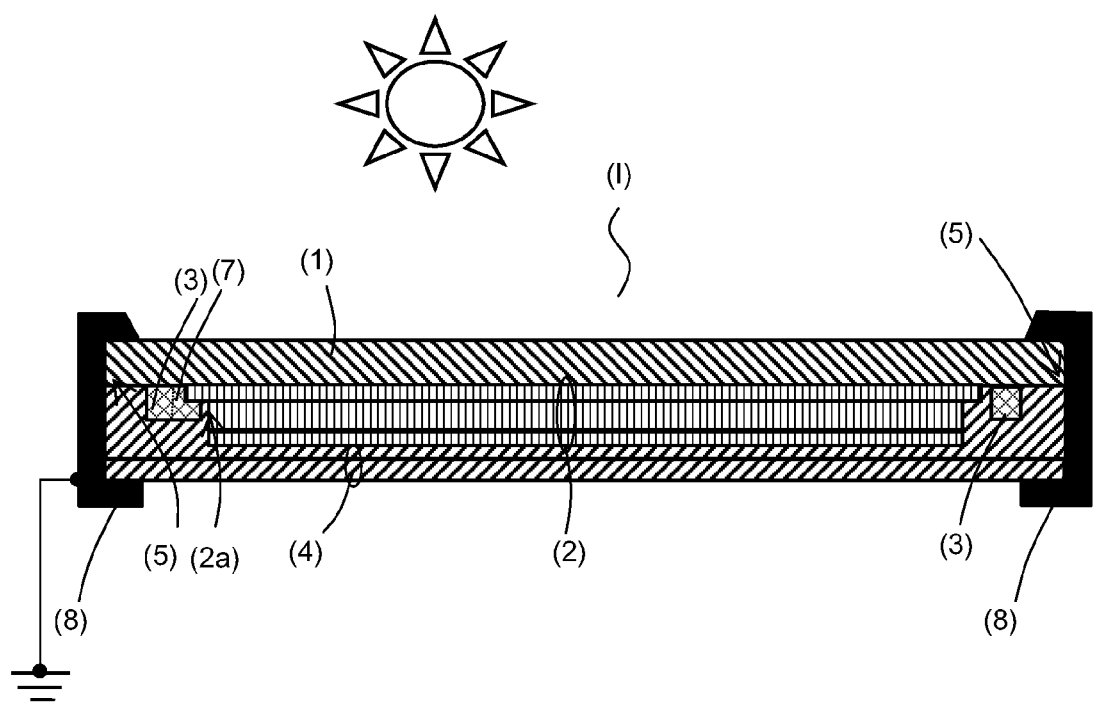
Figure 2:
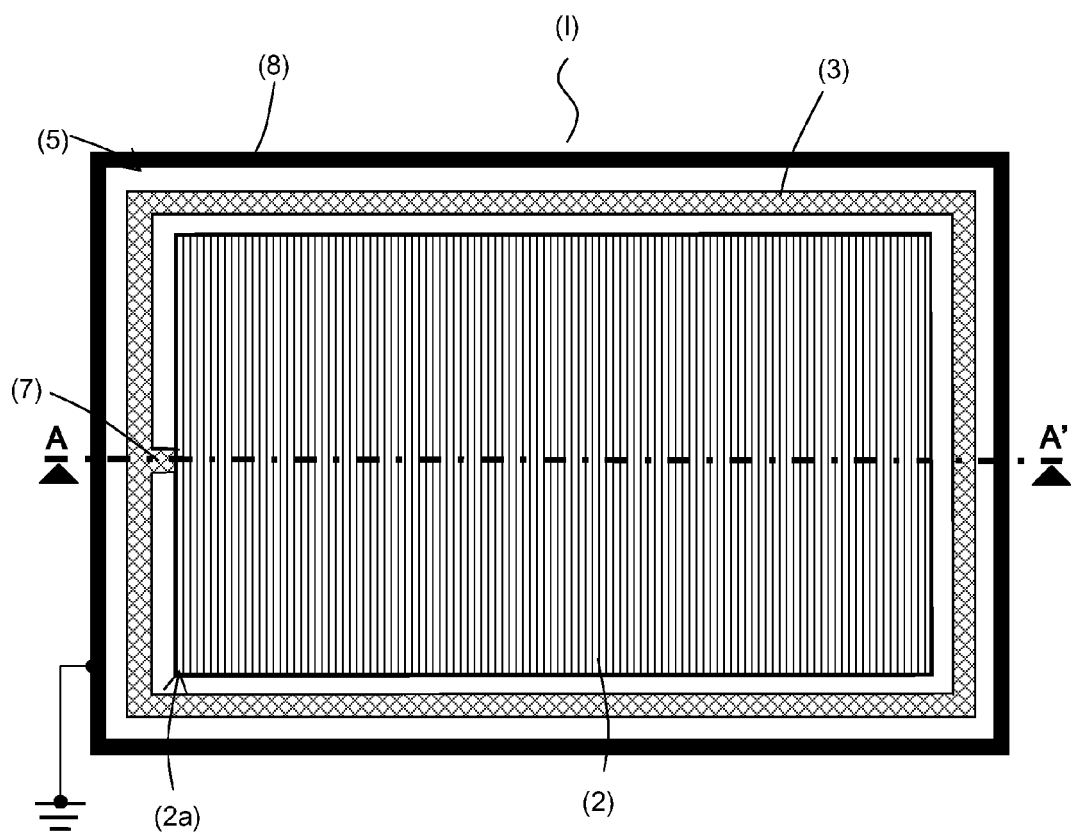
Figure 3:
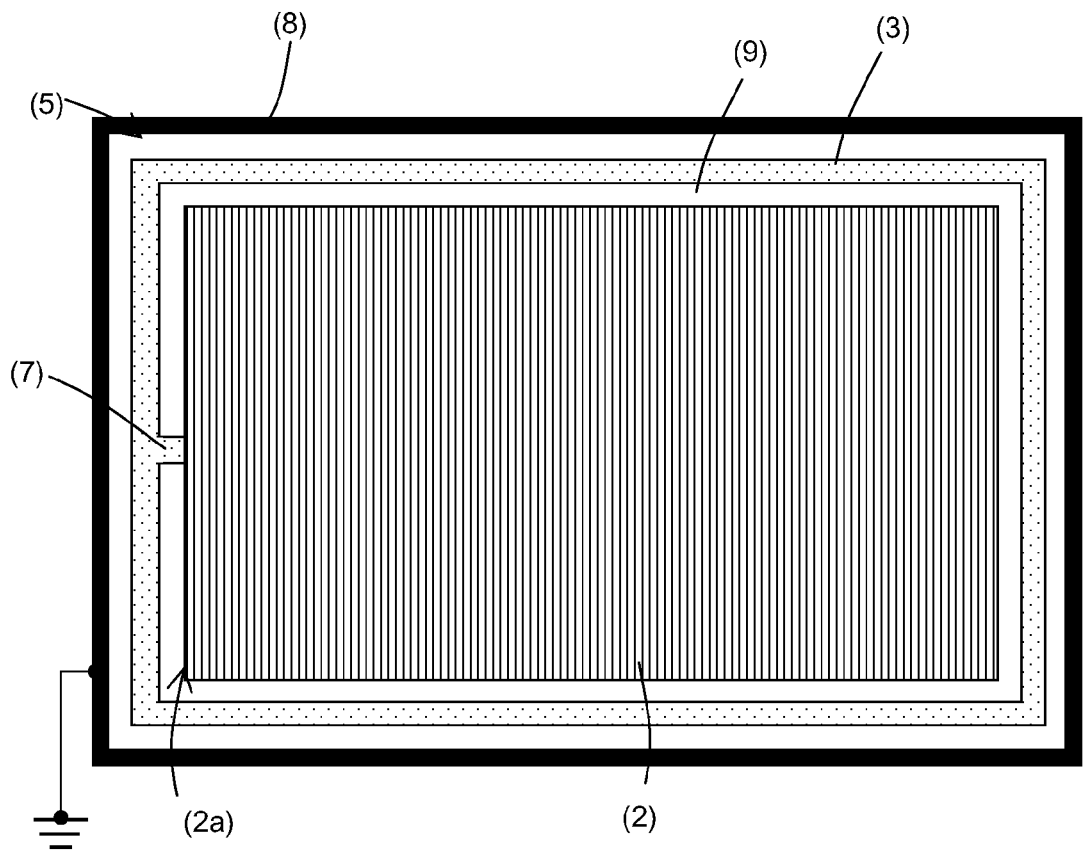
Figure 4:
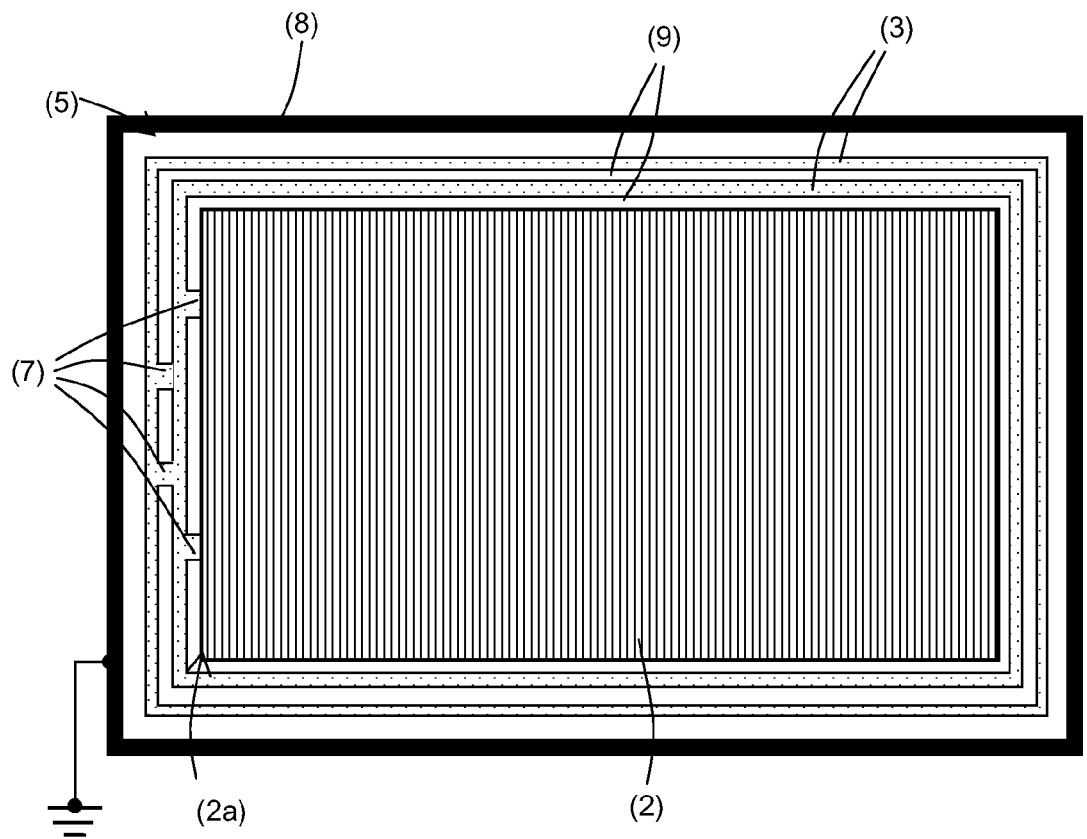
Figure 5:
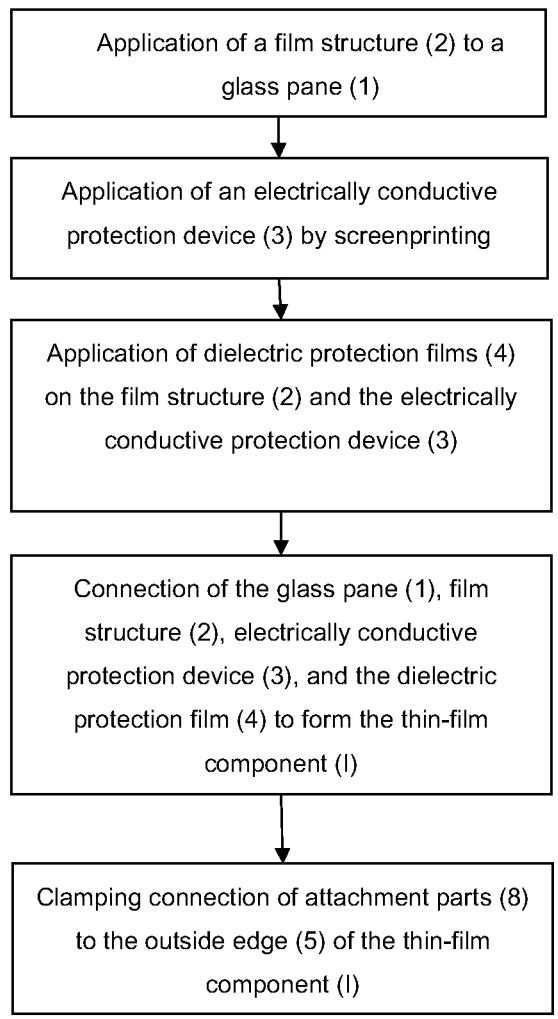
FIG. 5 depicts in detail an exemplary embodiment of the method according to the invention for the production of the thin-film component (I) in the flow diagram.
Figure 6:
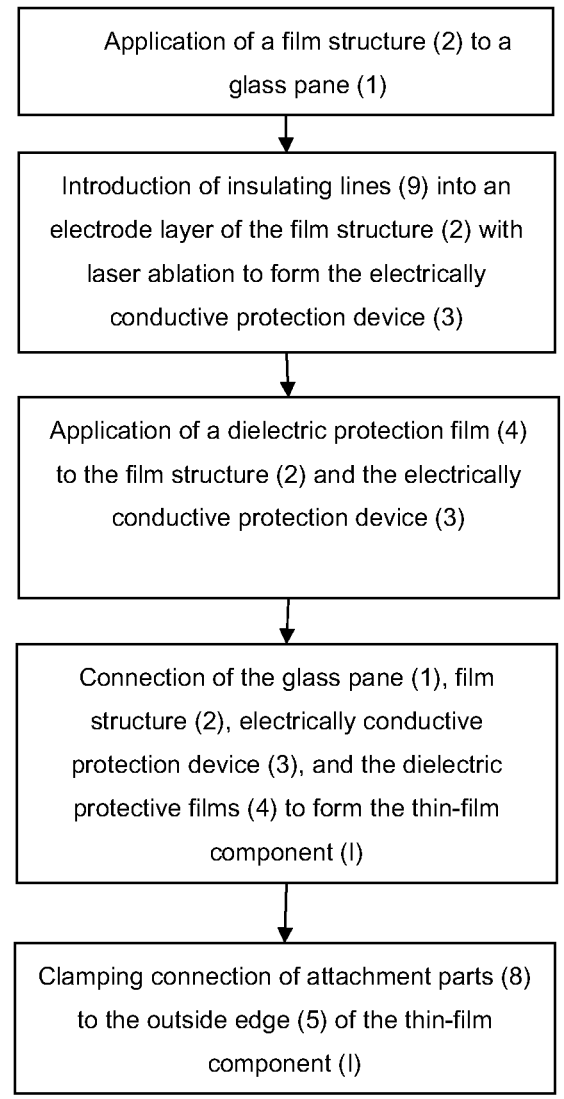
FIG. 6 depicts in detail an alternative exemplary embodiment of the method according to the invention for the production of the thin-film component (I) in the flow diagram.

LIST OF REFERENCE CHARACTERS (I) Thin-film component
(1) Glass pane (2) Film structure
(2a) Pole of the film structure
(3) Electrically conductive protection device
(4) Dielectric protection device
(5) Outside edge of the glass pane
(7) Contact area
(8) Attachment means
(9) Insulating lines

The invention claimed is:

1. A thin-film component comprising:
a glass pane;
a film structure and a single electrically conductive protection device applied to the glass pane, the electrically conductive protection device continuously extending around the film structure and galvanically connected to the film structure via at least one contact area on a pole of the film structure; and
at least one dielectric protection film applied to the film structure and the electrically conductive protection device,
wherein a distance between an outside edge of the electrically conductive protection device and an outside edge of the glass pane is smaller than a distance between the film structure and the outside edge of the glass pane, the electrically conductive protection device and the glass pane being so positioned to define a gap between the outside edge of the electrically conductive protection device and the outside edge of the glass pane.

2. The thin-film component according to claim 1, wherein the electrically conductive protection device is galvanically connected on the pole to a front electrode of the film structure.

3. The thin-film component according to claim 1, wherein the electrically conductive protection device is galvanically connected on the pole to a rear electrode of the film structure.

4. The thin-film component according to claim 1, wherein the electrically conductive protection device has a width of 0.5 mm to 5 mm.

5. The thin-film component according to 1, wherein the electrically conductive protection device at least partially surrounds the film structure.

6. The thin-film component according to claim 1, further comprising an electrically conductive attachment means applied on the outside edge of the thin film component.

7. The thin-film component according to claim 6, wherein the electrically conductive attachment means at least partially surrounds the thin-film component.

8. The thin-film component according to claim 1, wherein the electrically conductive protection device comprises silver, gold, copper, tungsten, nickel, chromium, molybdenum, tin oxide, zinc oxide, aluminum, silicon dioxide, silicon nitride, indium tin oxide, and / or combinations and mixtures thereof.

9. The thin-film component according to claim 1, wherein the glass pane comprises 0.1 wt.-% to 20 wt.-% alkali elements.

10. The thin-film component according to claim 1, wherein the at least one dielectric protection film comprises silicate glass, polyvinyl butyral (PVB), polyurethane (PU), polypropylene (PP), polyacrylate, polyethylene (PE), polycarbonate (PC), polymethylmethacrylate, polyvinyl chloride, polyacetate resin, casting resins, acrylates ethylene vinyl acetate (EVA), fluorinated ethylene propylenes, polyvinyl fluoride, ethylene-tetrafluoroethylene, copolymers, and / or mixtures thereof.

11. The thin-film component according to claim 1, wherein the film structure comprises thin-film photovoltaic cells with silicon, chalcopyrite, or cadmium-telluride.

12. The thin-film component according to claim 1, further comprising an electrically conductive attachment means applied on the outside edge of the glass pane.

13. The thin-film component according to claim 1, wherein the glass pane comprises 10 wt.-% to 16 wt.-% alkali elements.

14. The thin-film component according to claim 1, wherein the dielectric protection film is disposed within the gap.

15. A serial circuit of photovoltaic modules comprising:
a plurality of thin-film components according to claim 1.

16. The serial circuit of photovoltaic modules of claim 15, exhibiting, in use, a negative electric potential to ground being at least −100 V.

17. The serial circuit of photovoltaic modules of claim 15, exhibiting, in use, a negative electric potential to ground being at least −600 V.

18. A method for production of a thin-film-component, the method comprising:
a. applying a film structure to a glass pane;
b. applying a single electrically conductive protection device to the glass pane wherein the electrically conductive protection device continuously extends around the film structure and is galvanically connected to the film structure via at least one contact area on a pole of the film structure;
c. applying at least one dielectric protection film on the film structure and the electrically conductive protection device,
wherein a distance between an outside edge of the electrically conductive protection device and an outside edge of the glass pane is smaller than a distance between the film structure and the outside edge of the glass pane, the electrically conductive protection device and the glass pane being so positioned to define a gap between the outside edge of the electrically conductive protection device and the outside edge of the glass pane; and
d. connecting the glass pane, the film structure, the electrically conductive protection device, and the dielectric protection film together to form a thin-film component.

19. The method according to claim 18, wherein the electrically conductive protection device is formed by performing laser cutting-ablation or performing mechanical abrasion from subareas of the film structure with insulating lines.

20. The method according to claim 18, wherein the electrically conductive protection device is applied by printing methods selected from the group consisting of: screen printing, engraving cylinder printing, ink jet printing, aerosol jet printing, flexography, pulse jet printing, and combinations thereof.

21. The method according to claim 18, further comprising screwing, clamping, or bonding on attachment means with adhesive at least in subareas of an outside edge of the glass pane.

* * * * *